United States Patent [19]
Corio

[11] Patent Number: 5,436,921
[45] Date of Patent: Jul. 25, 1995

[54] HIGH DYNAMIC RANGE LASER DIODE DIRECT MODULATION

[75] Inventor: Mark A. Corio, Rochester, N.Y.

[73] Assignee: Eastman Kodak Company, Rochester, N.Y.

[21] Appl. No.: 263,854

[22] Filed: Jun. 22, 1994

[51] Int. Cl.⁶ .............................................. H01S 3/10
[52] U.S. Cl. ........................................ 372/26; 372/703
[58] Field of Search .................. 372/26, 31, 108, 700, 372/703

[56] References Cited
U.S. PATENT DOCUMENTS 4,755,016  7/1988  DeLoach et al. ................... 372/26
4,774,710  9/1988  Davis et al. ........................ 372/9

Primary Examiner—Rodney B. Bovernick
Assistant Examiner—Robert E. Wise
Attorney, Agent, or Firm—Milton S. Sales

[57] ABSTRACT

A high dynamic range laser diode modulation scheme employs two laser diodes connected so that their outputs are added in a single optical fiber. The first diode is modulated over its dynamic range. The second diode is also modulated over its dynamic range, and is attenuated with a filter to provide fine level adjustment to the coarse levels provided by the first diode.

13 Claims, 3 Drawing Sheets

HIGH DYNAMIC RANGE LASER DIODE DIRECT MODULATION

BACKGROUND OF THE INVENTION

1. Technical Field

This invention relates generally to laser beam modulation, and more particularly to such laser beam modulation used in laser printing/writing devices.

2. Background Art

Multiple level printing and writing systems that utilize sensitized media require that the media be exposed in a modulated fashion. This modulated exposure results in various image densities. A typical system may have the ability to generate image densities from 0.2 to 3.0. From data about the selected media (i.e. density vs. exposure) it can be determined that a range of densities will require a particular range of exposure energies. The dynamic range of these exposure energies may be defined as a ratio of the maximum exposure energy to the minimum exposure energy. A typical system utilizing silver halide film or sensitized paper may require a ratio of dynamic ranges of exposure energies greater than 100:1.

Exposure modulation in laser printing/writing devices may be accomplished through amplitude modulation and/or pulse-width modulation of the writing laser beam. One method currently in use is to modulate the beam of a gas (e.g. HeNe) or semiconductor (e.g. diode) laser with an external device such as an acousto-optic modulator. This method is fairly expensive, as it requires additional optic elements to propagate and shape the beam for modulation by such a device. Also, the modulating devices themselves are usually expensive.

To reduce the cost of a laser modulation system, it is desirable to directly modulate the output power of the laser source. This can be accomplished for example by modulating the drive current of a semiconductor laser diode. A limitation of direct modulation of a laser diode is that there is a threshold output power of the laser, above which the diode output is predominantly stimulated emission laser light and below which the diode output is predominantly spontaneous emission (FIG. 1). An output of predominantly spontaneous emission is undesirable as it does not propagate uniformly through the optical system to the exposure media. This limits the useful output power of the laser diode to those output powers generated above the threshold.

The ratio of the maximum output power of the laser diode to the output power of the laser diode available just above the threshold is considered the dynamic range of the device. In a typical laser diode this dynamic range is of the order of 15:1 to 50:1. This is below the requirements of many printing/writing systems.

Since most media are sensitive to the total integrated exposure, a pulse-width modulation approach, in addition to some amplitude modulation, may be used to achieve an improved dynamic range. An example of such a method is described in U.S. Pat. No. 4,774,710 which issued to Davis et al. in September, 1988. To implement pulse-width modulation at the desired pixel rates, though, higher speed circuitry is required (i.e. a fast settling digital-to-analog converter). This higher speed circuitry is required to maintain a particular throughput rate, as each pixel is now divided into many sub-pixels. For example, a 4-bit pulse-width modulation implementation writes sixteen subpixels, each of which are written in one-sixteenth of the time used to write a non-pulse width modulation pixel. This may require custom development of high speed devices from discrete components, since these circuits may not be commercially available as integrated devices.

DISCLOSURE OF THE INVENTION

It is an object of the present invention to provide a laser diode modulation scheme that is capable of a dynamic range of much greater than 256:1 without using pulse-width modulation, so as to allow implementation at reasonable pixel rates.

According to a feature of the present invention, two laser diodes are modulated through their respective usable ranges (i.e. from threshold to maximum power) with a selected (e.g. 8-bit) resolution. Each laser diode is coupled into an optical fiber (i.e. fiber pigtail) whose core diameter is selected to be single mode at the operating wavelength of the laser diode.

An optical attenuator is attached to the output of one of the fibers. The attenuation factor is selected such that the output of the attenuator, with the associated laser diode operating at maximum output, is greater than that of the output of the other laser diode operating at a minimum setting (i.e. just above threshold). The fiber attached to the laser diode without the attenuator and the output of the attenuator are both attached to inputs of a fiber optic combiner. The output of the combiner will be the sum of the two signals, minus coupling losses.

To calibrate the system, each laser diode is driven through each of its selected settings (e.g. 256 levels determined by an 8-bit digital-to-analog converter) while the output is monitored. A look-up table is then generated, whose output is composed of a value for each of the two laser diodes (e.g. 8-bits for each laser diode). This look-up table is determined to provide the desired output intensities for a given range of input values. For example, this may be done to provide the correct intensities to result in a linear relationship between the input value and the density of the exposed media after processing.

The present invention provides exposure dynamic ranges of greater than 256:1 with 8-bit resolution systems. It is also possible to use resolutions of other than 8-bits for each laser diode's modulation and/or use more than two laser diodes to achieve more or less system modulation resolution, dynamic range, and/or maximum output power. Additional benefits may also be realized with this system, as the fiber-optic elements of the system provide some dynamic range improvement of their own by propagating the spontaneous emissions of the laser diode less efficiently than the stimulated emission, thus lowering the threshold output level relative to the maximum output level. The fiber optic elements also provide for easy laser diode replaceability through connectorization of the fibers using techniques similar to those used in the telecommunications industry.

The invention, and its objects and advantages, will become more apparent in the detailed description of the preferred embodiments presented below.

BRIEF DESCRIPTION OF THE DRAWINGS

In the detailed description of the preferred embodiments of the invention presented below, reference is made to the accompanying drawings, in which.

BEST MODE FOR CARRYING OUT THE INVENTION

The present description will be directed in particular to elements forming part of, or cooperating more directly with, apparatus in accordance with the present invention. It is to be understood that elements not specifically shown or described may take various forms well known to those skilled in the art.

Figure 1:
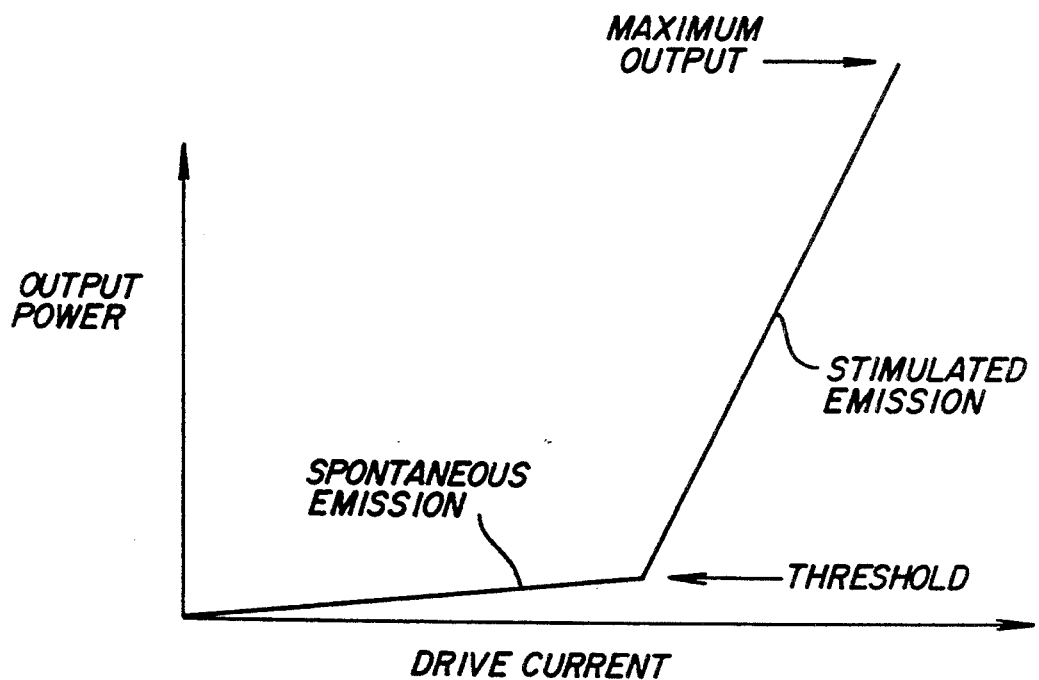
FIG. 1 is a graph that represents a relationship between drive current and output power of a typical laser diode.
Figure 2:
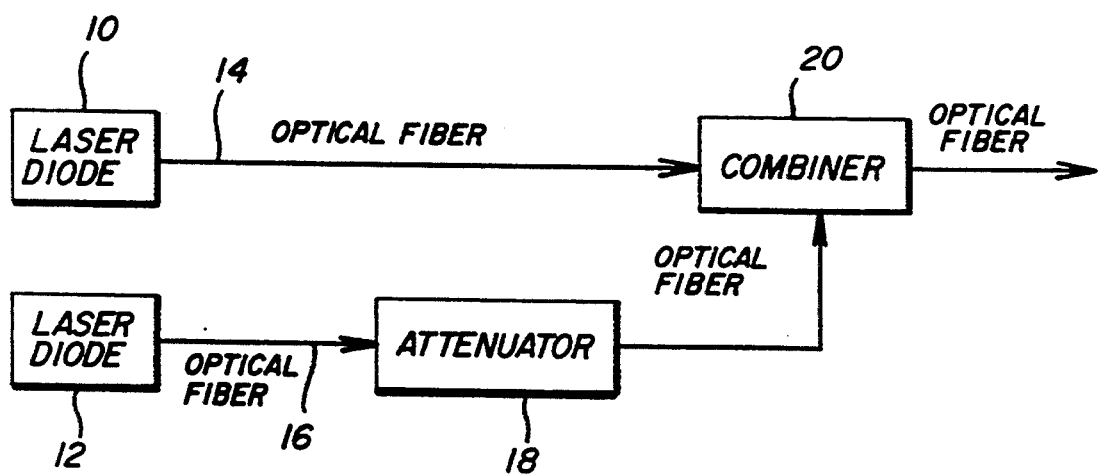
FIG. 2 is a block diagram of the optical system of a preferred embodiment of the invention.

Referring to FIG. 2, a direct semiconductor laser modulation scheme with a dynamic range much greater than 256:1 is realizable in a system containing two laser diodes 10 and 12. In a preferred configuration, each of the laser diodes is permanently coupled to a short length of single mode fiber optic cable (i.e. fiber pigtail) 14 and 16, respectively. Laser diodes that are coupled to this type of optical fibers are commercially available. The output of one of these fibers (fiber 16 as illustrated) is coupled to a fiber optic attenuator 18. The output from the other fiber and the output from the attenuator are coupled into the input fibers of a fiber optic combiner 20. The output of the fiber optic combiner is the sum of the two inputs, one of them attenuated, less the coupling losses at the fiber connections in the system.

Laser diode 10 connected, via fiber, directly to combiner 20 is used as a coarse adjustment in setting the output power. Laser diode 12 that is connected, via fiber, to the combiner through attenuator 18 is used as a fine adjustment in setting the output power.

Figure 3:
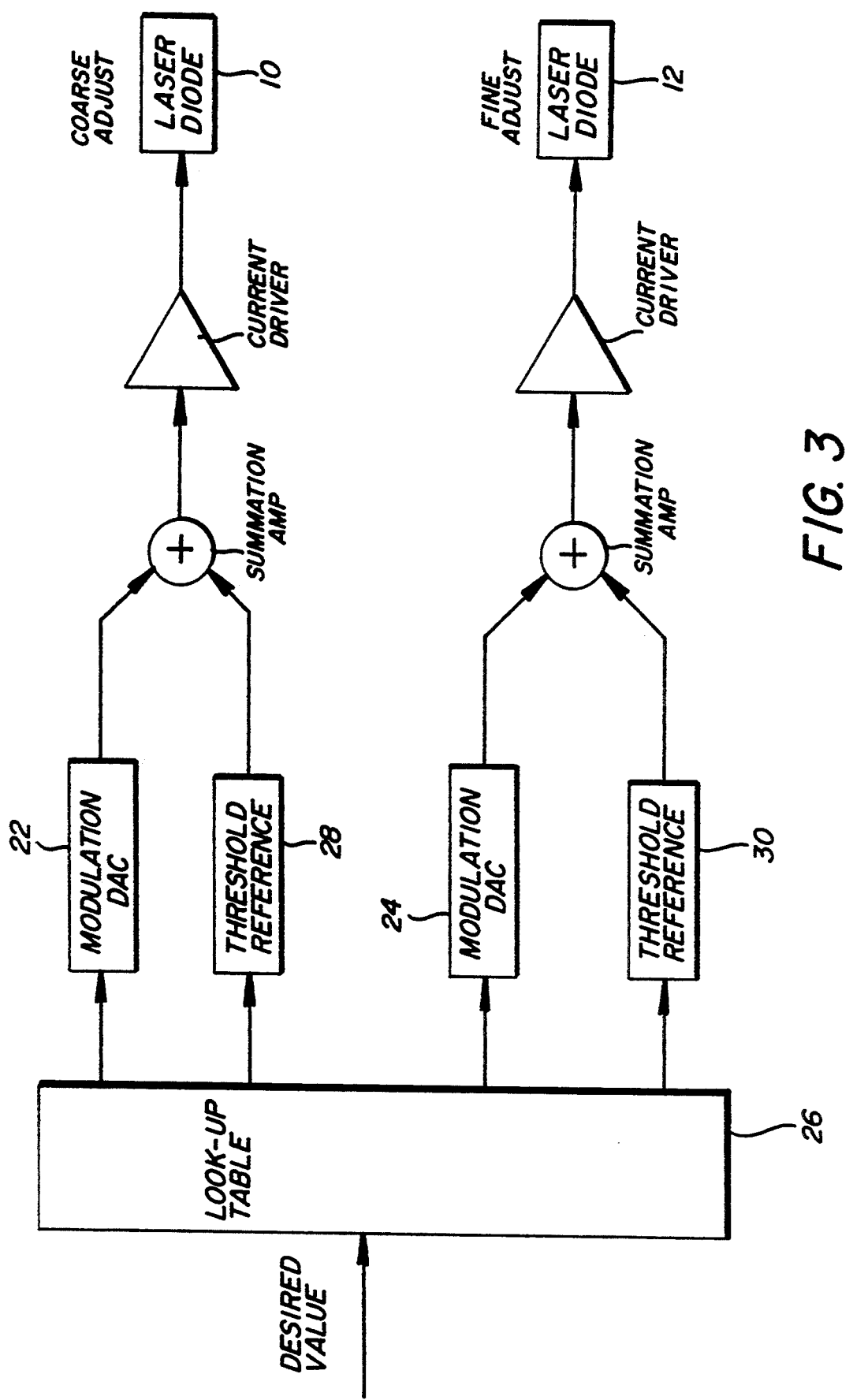
FIG. 3 is a block diagram of the electronic system of the preferred embodiment of the invention.

Referring to FIG. 3, the output of an 8-bit digital-to-analog converter 22 is used to set the drive current of coarse adjust laser diode 10. The output of an 8-bit digital-to-analog converter 24 is used to set the drive current of fine adjust laser diode 12.

Figure 4:
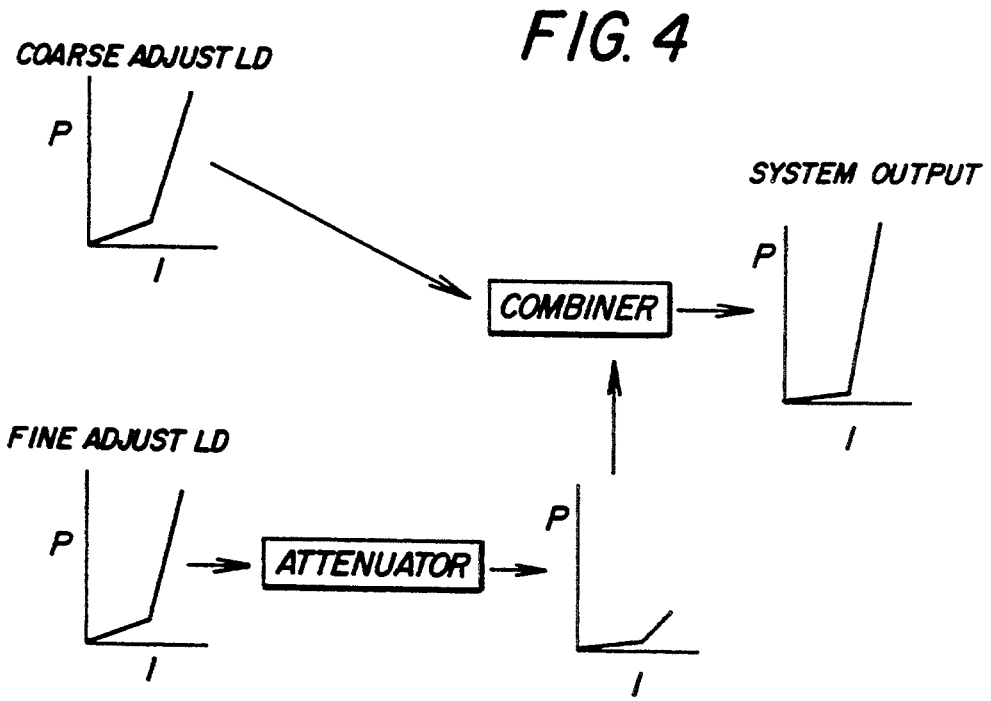
FIG. 4 is a group of graphs showing the laser power vs. drive current at several locations in the system.

Referring to FIG. 4, the optical attenuation of fine adjustment laser diode 12 should be selected such that the output with the fine adjust laser diode at maximum output power is greater than the output with coarse adjustment laser diode 10 set at its threshold level. The combined outputs then provide a dynamic range equal to the output with both laser diodes operating at full output level, divided by the output with coarse adjustment laser diode 10 turned off and fine adjustment laser diode 12 set at its threshold level. Note that the threshold level is exaggerated so as to be visible in the illustrations. Note also that the current "I" in the graph illustrating the system output is not a real current. It is a normalized current, representing a combination of the currents to the two individual diodes, which gives a reference against which to plot the output power.

As an example, the above method may be used to provide accurate amplitude modulation with a dynamic range of 512:1 using two laser diodes each having individual dynamic ranges of 30:1. The attenuation for fine adjust laser diode 12 is set to provide a maximum output that is equal to slightly more than the threshold level of coarse adjustment laser diode 10. A look-up table 26 (FIG. 3) is used that takes 9-bit values as inputs and generates two 8-bit values as outputs. One of the 8-bit outputs is used for setting the output of digital-to-analog converter 22 for driving coarse adjustment laser diode 10. The other 8-bit output is used for setting the output of digital-to-analog converter 24 for driving fine adjustment laser diode 12.

Since the output of a digital-to-analog converter is not completely linear, there will be some errors introduced. Fine adjustment laser diode 12 may also be used to compensate for these types of errors from coarse adjustment laser diode 10. The overall amplitude modulation error (i.e. assuming $+/-\frac{1}{2}$ bit digital-to-analog converter accuracy) of such a system would be better than 0.01% (i.e. 1 part in 7680). This assumes both laser diodes have individual dynamic ranges of 30:1 and the attenuator for fine adjustment laser diode 12 is set to provide a maximum output equal to twice that of coarse adjustment laser diode 10 at threshold level.

Figure 5:
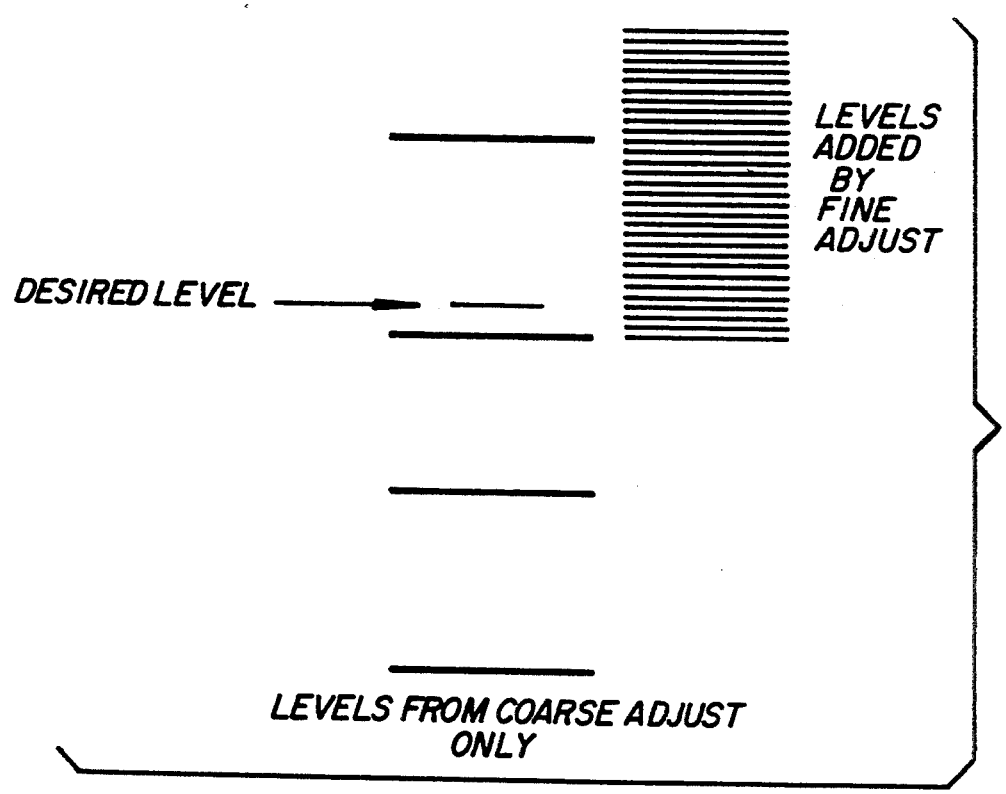
FIG. 5 is a drawing illustrating the selection of a coarse adjust level and a fine adjust level to achieve a desired level.

To generate the appropriate look-up table, each laser diode is individually driven with each digital-to-analog converter setting. The system output power is recorded. For each desired system output level (i.e. each input to the look-up table), the closest setting for coarse adjust laser diode 10 that does not exceed the desired output value is selected. An appropriate setting for fine adjust laser diode 12 is selected such that when the output of the system at that setting is added to the output of the system at the selected coarse adjust setting, the combined output will be the closest possible to the desired system output (see FIG. 5).

If the maximum output of the system is to be adjustable without affecting the dynamic range, a variable optical attenuator may be installed after the fiber optic combiner to provide this adjustment.

Referring back to FIG. 3, an appropriate threshold current, in addition to the modulation current, is provided for all non-zero modulation settings. This is accomplished with an analog voltage supplied by a digital-to-analog converter 28 and 30 for each laser diode 10 and 12, respectively being added to the voltage from modulation digital-to-analog converters 22 and 24. This voltage, which establishes the threshold drive current, is switched in whenever a non-zero value is applied to the modulation digital-to-analog converter and is driven to zero volts when a zero value is applied to the modulation digital-to-analog converter. Each threshold drive current is controlled by outputs from look-up table 26.

If reflections from the ends of the optical fibers or other optical elements are returned to the laser diode, laser instabilities may result. To address this possibility, a high frequency signal may be added to modulate the laser diode drive current. The frequency of this signal is selected such that when laser light is reflected off of optical components in the system, they arrive back at the laser diode during the time that the current to the laser diode is zero. The returning laser light, therefore, does not contribute to instabilities of the laser diode output.

If laser light from one of the laser diodes is reflected by components in the system and returns to the other laser diode, it may cause instabilities in that laser diode also. To avoid this type of coupling, the phase relationship between the high frequency signals used to modulate the two laser diodes may be changed so that the reflected signals, again, return to the diodes during the "OFF" portion of the laser diode drive current signal.

Although a two laser diode implementation has been described, it should not be taken as a limitation. This approach may be implemented with more than two laser diodes to additionally improve dynamic range and/or increase the maximum available output power if the additional performance is required.

The invention has been described in detail with particular reference to preferred embodiments thereof, but it will be understood that variations and modifications can be effected within the spirit and scope of the invention.

What is claimed is:

1. Apparatus for amplitude modulating the energy output of a semiconductor laser system; said apparatus comprising:
   two semiconductor lasers, each laser having (1) a maximum output power and (2) a threshold output power above which the laser output is predominantly stimulated emission laser light and below which the laser output is predominantly spontaneous emission laser light, such that a usable range of each laser extends from an output power just above the threshold to the maximum output power;
   means for modulating the lasers through their respective usable ranges;
   an optical attenuator on the output of one of said lasers; and
   means for combining the output of the optical attenuator and the output of the other laser.

2. Apparatus as set forth in claim 1 wherein said combining means is a fiber optic combiner.

3. Apparatus as set forth in claim 1 wherein the attenuator has an attenuation factor selected such that the power output of the attenuator, with the one laser operating at substantially maximum power output, is greater than the power output of the other laser operating at an output power just above its threshold.

4. Apparatus as set forth in claim 1 wherein said two semiconductor lasers are coupled to a respective optical fiber.

5. Apparatus as set forth in claim 4 wherein:
   each laser has an operating wavelength; and
   said optical fiber has a core diameter selected to be single mode at the operating wavelength of the respective laser.

6. Apparatus as set forth in claim 4 wherein each laser is permanently coupled to its respective optical fiber.

7. Apparatus as set forth in claim 1 wherein each laser has a drive current set by output values of a look-up table.

8. Apparatus as set forth in claim 7 wherein the look-up table is generated by individually driving both lasers with a plurality of input settings, identifying the closest setting to each desired system output level that does not exceed the desired output level for the non-attenuated laser, selecting a setting for the attenuated laser such that, when the output of the system at that setting is added to the output of the system at the selected setting the non-attenuated laser, the combined output will be the closest possible to the desired system output.

9. A method for amplitude modulating the energy output of a semiconductor laser system having two semiconductor lasers, each laser having (1) a maximum output power and (2) a threshold output power above which the laser output is predominantly stimulated emission laser light and below which the laser output is predominantly spontaneous emission laser light, such that a usable range of each laser extends from an output power just above the threshold to the maximum output power; said method comprising the steps of:
   modulating the lasers through their respective usable ranges;
   optically attenuating on the output of one of said lasers; and
   combining the output of the optical attenuator and the output of the other laser.

10. A method as set forth in claim 9 wherein the attenuation step includes selecting the attenuation factor selected such that the power output after attenuation, with the one laser operating at substantially maximum power output, is greater than the power output of the other laser operating at an output power just above its threshold.

11. A method as set forth in claim 9 comprising the further step of setting a drive current for each laser by output values of a look-up table.

12. A method as set forth in claim 11 comprising the further step of generating the look-up table by:
   individually driving both lasers with a plurality of input settings;
   identifying the closest setting to each desired system output level that does not exceed the desired output level for the non-attenuated laser; and
   selecting a setting for the attenuated laser such that, when the output of the system at that setting is added to the output of the system at the selected setting the non-attenuated laser, the combined output will be the closest possible to the desired system output.

13. A method as set forth in claim 11 comprising the further step of generating a look-up table having an output value for each input value by calibrating each laser by driving it through selected settings and monitoring its power output.

* * * * *